(12) United States Patent
Li et al.

(10) Patent No.: US 11,751,461 B2
(45) Date of Patent: Sep. 5, 2023

(54) DISPLAY MOTHERBOARD, FABRICATING METHOD AND ALIGNING METHOD OF DISPLAY MOTHERBOARD

(71) Applicants: Chengdu BOE Optoelectronics Technology Co., Ltd., Chengdu (CN); BOE TECHNOLOGY GROUP CO., LTD., Beijing (CN)

(72) Inventors: Shuo Li, Beijing (CN); Ling Shi, Beijing (CN); Yuan He, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 255 days.

(21) Appl. No.: 17/228,908

(22) Filed: Apr. 13, 2021

(65) Prior Publication Data

US 2022/0093692 A1 Mar. 24, 2022

(30) Foreign Application Priority Data

Sep. 23, 2020 (CN) .......................... 202011009790.1

(51) Int. Cl.
| | |
|---|---|
| *H10K 59/40* | (2023.01) |
| *G06F 1/18* | (2006.01) |
| *H10K 50/86* | (2023.01) |
| *H10K 71/00* | (2023.01) |
| *H10K 59/12* | (2023.01) |

(52) U.S. Cl.
CPC ............. *H10K 59/40* (2023.02); *G06F 1/184* (2013.01); *H10K 50/865* (2023.02); *H10K 71/00* (2023.02); *H10K 59/1201* (2023.02)

(58) Field of Classification Search
None
See application file for complete search history.

(56) References Cited

U.S. PATENT DOCUMENTS

| | | | |
|---|---|---|---|
| 2014/0146299 A1* | 5/2014 | Nomura | ................ H01L 21/682 355/72 |
| 2015/0338700 A1* | 11/2015 | Kimura | ............. G02F 1/133514 349/12 |
| 2016/0103359 A1* | 4/2016 | Kimura | ................ G06F 3/0412 349/33 |
| 2017/0192320 A1* | 7/2017 | Wang | ................ G02F 1/136209 |

\* cited by examiner

*Primary Examiner* — J. E. Schoenholtz
(74) *Attorney, Agent, or Firm* — XSENSUS LLP

(57) ABSTRACT

The present disclosure provides a display motherboard, a method for fabricating the same, and a method for aligning the same. The display motherboard includes an array substrate on which an alignment mark and a color film layer are provided. A portion of a black matrix of the color film layer in an alignment mark area includes a first light-shielding portion and a second light-shielding portion. The first light-shielding portion covers the alignment mark, and the second light-shielding portion covers an area outside the alignment mark, where upper surfaces of the first light-shielding portion and the second light-shielding portion are not in the same plane. When the display motherboard is aligned in the subsequent processes, since the black matrix forms the same pattern as the alignment mark due to a height step, when the exposure machine exposures, the pattern can be directly captured for alignment.

17 Claims, 11 Drawing Sheets

| Mark Type | Mark | Alignment Picture |
|---|---|---|
| "Island shape" mark | Swastika shape | |
| | Cross shape | |
| "Window shape" mark | Swastika shape | |
| | Cross shape | |

FIG. 11

DISPLAY MOTHERBOARD, FABRICATING METHOD AND ALIGNING METHOD OF DISPLAY MOTHERBOARD

CROSS-REFERENCE TO RELATED APPLICATION

This application is based on and claims priority to Chinese Patent Application No. 202011009790.1 filed on Sep. 23, 2020, where the entire contents of which are hereby incorporated by reference herein for all purposes.

TECHNICAL FIELD

The present disclosure relates to display technology and, more particularly, to a display motherboard, a method for fabricating the display motherboard, and a method for aligning the display motherboard.

BACKGROUND

Organic Light Emitting Diode (OLED) display panels have many advantages, such as self-illumination, ultra-thinness, fast response speed, high contrast, wide viewing angle, etc., and are the display panels that are currently receiving widespread attention.

For OLED display panels, a technology of Color filter On Encapsulation (COE) has been developed, that is, a color film layer is directly fabricated on an encapsulation layer on the light-exiting side of the OLED display panel. This technology has the advantages such as increase of color gamut and reduction of power consumption, etc.

During the fabrication of an OLED display panel, many alignment marks are provided in a peripheral area of a display motherboard. The alignment marks are mainly used for alignment of the exposure machine, and alignment of vapor deposition and packaging equipment, to make the following procedure and the former procedure overlap in position, such that each film layer can be precisely formed. For an OLED display panel implementing COE technology, a black matrix (BM) needs to be formed during the formation of the color film layer and, when a portion of the black matrix located in the peripheral area covers the alignment marks, it will affect the subsequent alignment and thereby affect the yield of the display panel.

It should be noted that information illustrated in the background technology is provided only for acquiring a better understanding of the background of the disclosure and therefore may include information that is not prior art already known to those of ordinary skilled in the art.

SUMMARY

It is an object of the present disclosure to provide a display motherboard, a method for fabricating the display motherboard, and a method for aligning the display motherboard, which at least partially solve one or more problems in the related art.

According to an aspect of the present disclosure, there is provided a display motherboard, wherein the display motherboard includes a display area and a peripheral area surrounding the display area, the peripheral area includes an alignment mark area, and the display motherboard includes:

an array substrate;

an alignment mark, disposed on the array substrate and in the alignment mark area; and a color film layer, including a filter layer and a black matrix, wherein at least a portion of the black matrix is located in the alignment mark area, wherein the portion of the black matrix in the alignment mark area includes a first light-shielding portion and a second light-shielding portion, the first light-shielding portion covers the alignment mark, and the second light-shielding portion covers an area outside the alignment mark in the alignment mark area, and wherein a surface of the first light-shielding portion distal to the array substrate and a surface of the second light-shielding portion distal to the array substrate are not in a same plane.

In an exemplary embodiment of the present disclosure, the display motherboard further includes: an organic layer, disposed on the array substrate and at least in the alignment mark area, wherein the portion of the black matrix in the alignment mark area is disposed on one side of the organic layer distal to the array substrate, wherein the alignment mark is formed in the organic layer.

In an exemplary embodiment of the present disclosure, the organic layer is a single layer or includes a plurality of layers.

In an exemplary embodiment of the present disclosure, the display motherboard further includes an organic light-emitting device located in the display area, and the organic light-emitting device includes:

a first electrode, disposed on the array substrate;

a pixel definition layer, disposed on one side of the first electrode distal to the array substrate, wherein the pixel definition layer has an opening area, and the opening area exposes the first electrode;

an organic light-emitting function layer, disposed on one side of the first electrode distal to the array substrate and located in the opening area; and a second electrode, disposed on one side of the organic light-emitting function layer distal to the array substrate, wherein the organic layer and the pixel definition layer are provided in a same layer.

In an exemplary embodiment of the present disclosure, the display motherboard further includes a touch function layer disposed in the display area, and the touch function layer is located between the array substrate and the black matrix, including:

a first touch electrode layer, disposed on the array substrate;

a dielectric layer, disposed on one side of the first touch electrode layer distal to the array substrate;

a second touch electrode layer, disposed on one side of the dielectric layer distal to the first touch electrode layer and located on one side of the black matrix close to the array substrate; and a protective layer, disposed on one side of the second touch electrode layer distal to the dielectric layer, wherein the organic layer and the protective layer are provided in a same layer.

In an exemplary embodiment of the present disclosure, the organic layer has a hollow portion penetrating the array substrate in a thickness direction, and the hollow portion forms the alignment mark, wherein the first light-shielding portion of the black matrix covers the hollow portion of the organic layer, and the second light-shielding portion covers a portion of the organic layer outside the hollow portion.

In an exemplary embodiment of the present disclosure, the organic layer has a hollow portion penetrating the array substrate in a thickness direction, and a portion of the organic layer outside the hollow portion forms the alignment mark, wherein the first light-shielding portion of the black matrix covers the portion of the organic layer outside the hollow portion, and the second light-shielding portion covers the hollow portion of the organic layer.

In an exemplary embodiment of the present disclosure, a thickness of the organic layer and a step of the organic layer is between 1.5 μm and 2.5 μm.

According to another aspect of the present disclosure, there is provided a method for fabricating a display motherboard, including:

providing an array substrate, wherein the array substrate is divided into a display area and a peripheral area surrounding the display area, and the peripheral area includes an alignment mark area;

forming an alignment mark in the alignment mark area of the array substrate; and forming a color film layer on the array substrate, wherein the color film layer includes a filter layer and a black matrix, and at least a portion of the black matrix is formed in the alignment mark area, wherein, when the black matrix is formed, the portion of the black matrix located in the alignment mark area is formed to include a first light-shielding portion and a second light-shielding portion, the first light-shielding portion covers the alignment mark, and the second light-shielding portion covers an area outside the alignment mark in the alignment mark area, wherein, when the first light-shielding portion and the second light-shielding portion are formed, a surface of the first light-shielding portion distal to the array substrate and a surface of the second light-shielding portion distal to the array substrate are not in a same plane.

In an exemplary embodiment of the present disclosure, forming the alignment mark in the alignment mark area of the array substrate includes:

forming an organic layer in the alignment mark area, such that the organic layer has a hollow portion penetrating the array substrate in a thickness direction, and the hollow portion of the organic layer forms the alignment mark or a portion of the organic layer outside the hollow portion forms the alignment mark.

In an exemplary embodiment of the present disclosure, the fabricating method further includes forming an organic light-emitting device in the display area, and forming the organic light-emitting device includes:

forming a first electrode on the array substrate;

forming a pixel definition layer on one side of the first electrode distal to the array substrate, wherein the pixel definition layer has an opening area, such that the opening area exposes the first electrode;

forming an organic light-emitting function layer on one side of the first electrode distal to the array substrate, such that the organic light-emitting function layer is located in the opening area; and forming a second electrode on one side of the organic light-emitting function layer distal to the array substrate, wherein the organic layer and the pixel definition layer are formed of a same material by a same patterning process.

In an exemplary embodiment of the present disclosure, the fabricating method further includes forming a touch function layer in the display area, and forming the touch function layer includes:

forming a first touch electrode layer on the array substrate;

forming a dielectric layer on one side of the first touch electrode layer distal to the array substrate;

forming a second touch electrode layer on one side of the dielectric layer distal to the first touch electrode layer; and forming a protective layer on one side of the second touch electrode layer distal to the dielectric layer, wherein the organic layer and the protective layer are formed of a same material by a same patterning process, and wherein the black matrix is formed on one side of the touch function layer distal to the array substrate.

According to a further another aspect of the present disclosure, there is provided a method for aligning the above-described display motherboards, including:

placing the display motherboard into an exposure machine, moving a capturing device of the exposure machine above the alignment mark area, identifying a pattern formed by the first light-shielding portion and the second light-shielding portion, and aligning through the pattern formed by the first light-shielding portion and the second light-shielding portion.

The alignment mark and the black matrix covering the alignment mark are provided in the alignment mark area of the display motherboard of the present disclosure, the first light-shielding portion of the black matrix covers the alignment mark, the second light-shielding portion covers the area outside the alignment mark in the alignment mark area, and the upper surfaces of the first light-shielding portion and the second light-shielding portion are not in the same plane, thereby the black matrix forms the same pattern as that of the alignment mark in the alignment mark area due to a height step. When the exposure machine is used for exposure and alignment during subsequent processes, the same pattern as that of the alignment mark can be clearly displayed and can be directly captured for alignment. The alignment method has high alignment efficiency and accurate alignment, which improves the production capacity and yield of the display panels.

It is to be understood that both the foregoing general description and the following detailed description are exemplary and explanatory only and are not restrictive of the disclosure.

BRIEF DESCRIPTION OF THE DRAWINGS

The accompanying drawings, which are incorporated in and constitute part of this specification, illustrate embodiments consistent with the disclosure and, together with the description, serve to explain the principles of the disclosure. Understandably, the drawings in the following description are only for illustrating some embodiments of the present disclosure, and based on the drawings, those of ordinary skill in the art can further derive other drawings without paying any creative effort.

FIG. 11 is an effect diagram of alignment and exposure of the display motherboard according to an embodiment of the present disclosure.

DETAILED DESCRIPTION

Figure 1:
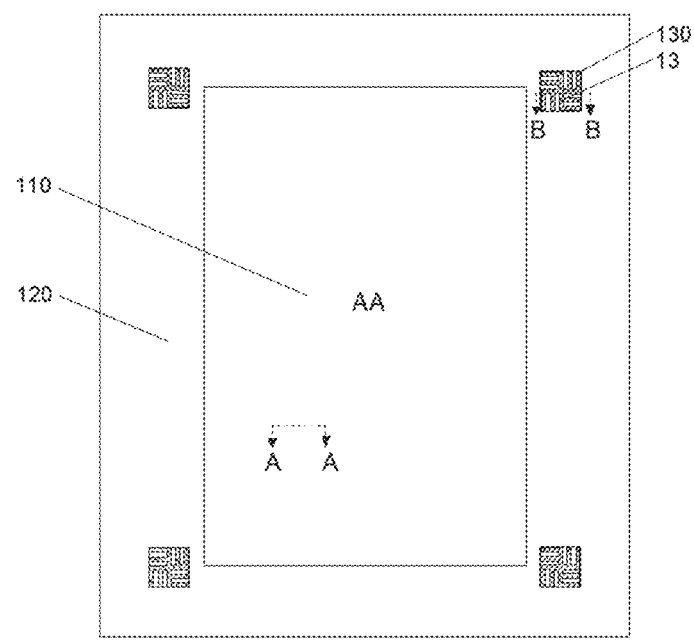
FIG. 1 is a structural schematic diagram illustrating an OLED display motherboard in an exemplary embodiment of the present disclosure.

Exemplary embodiments will now be fully described by reference to the accompanying drawings. However, the exemplary embodiments can be implemented in various forms and should not be understood as being limited to the examples set forth herein; rather, the embodiments are provided such that the disclosure will be thorough and complete, and the conception of exemplary embodiments will be fully conveyed to those skilled in the art. The same reference signs in the drawings denote the same or similar structures and detailed description thereof will be omitted.

The following reference numbers are used in the drawings: 110—display area; 120—peripheral area; 130—alignment mark area; 13—alignment mark; 131—hollow portion; 20—external protective layer; 30—light-shielding portion; 31—first light-shielding portion; 32—second light-shielding portion; 40—light-transmitting portion; 50—buffer layer; 51—first touch electrode layer; 52—dielectric layer; 53—second touch electrode layer; 54—protective layer; 60—encapsulation layer; 61—first inorganic encapsulation layer; 62—organic encapsulation layer; 63—second inorganic encapsulation layer; 80—first electrode layer; 81—pixel definition layer; 82—light-emitting layer; 83—second electrode layer; 90—gate insulating layer; 91—active layer; 93—gate electrode layer; 94—interlayer insulating layer; 95—source-drain layer; 96—passivation layer; 97—planarization layer; and 100—substrate.

In relevant technology, when fabricating OLED display panels, alignment marks on the display motherboard are generally metal alignment marks fabricated on a gate-electrode metal layer (GE) or a source-drain metal layer (SD) through dry etching. When COE technology is implemented, since the black matrix will be coated on the display motherboard, before exposure, the exposure machine needs to be accurately aligned with the alignment marks firstly and then perform exposure. However, since the black matrix is made of opaque material and the gate-electrode metal layer or the source-drain metal layer has a small thickness, a thickness step (i.e., height difference) of the formed alignment mark is small, thus the black matrix still expresses a whole black film layer when it covers the alignment marks. As such, it is difficult for the exposure machine to capture the alignment marks for alignment through the black matrix. The solution at present is to manually clean the material of the black matrix at the alignment marks in the peripheral area to expose the alignment marks for alignment. However, this method is inefficient and susceptible to human factors, and affects both the production capacity and yield of the display panels.

Based on the above, an embodiment of the present disclosure provides an OLED display motherboard having alignment marks, and the alignment marks on the OLED display motherboard can be easily identified and is applicable to the display panel adopting COE technology.

Referring to FIGS. 1-9, a display motherboard according to an embodiment of the present disclosure includes a display area 110 and a peripheral area 120 surrounding the display area 110. The peripheral area 120 includes an alignment mark area 130. The display motherboard includes an array substrate. The alignment mark area 130 of the display motherboard, i.e., the alignment mark area 130 of the array substrate, is provided with an alignment mark 13. The array substrate is further provided with a color film layer. The color film layer includes a filter layer (or light-transmitting portion) 40 and a black matrix 30, at least a portion of the black matrix 30 is located in the alignment mark area 130. The portion of the black matrix 30 located in the alignment mark area 130 includes a first light-shielding portion 31 and a second light-shielding portion 32. The first light-shielding portion 31 covers the alignment mark 13 and the second light-shielding portion 32 covers an area outside the alignment mark 13 in the alignment mark area 130. A surface of the first light-shielding portion 31 distal to the array substrate and a surface of the second light-shielding portion 32 distal to the array substrate are not in the same plane.

In the alignment mark area 130, there is a height difference between the alignment mark 13 and the remaining area. In the present disclosure, the black matrix 30 is provided on the alignment mark 13 in such a manner that the surface of the first light-shielding portion 31 distal to the array substrate and the surface of the second light-shielding portion 32 distal to the array substrate are not in the same plane. That is, a height of the first light-shielding portion 31 covering the alignment mark 13 is different from that of the second light-shielding portion 32 covering the area outside the alignment mark 13 in the alignment mark area 130, thereby forming the height difference between the first light-shielding portion 31 and the second light-shielding portion 32. The black matrix 30 forms a pattern the same as that of the alignment mark 13 in the alignment mark area 130 due to the height difference, which is equal to "copying" the alignment mark 13 below. A pattern the same as that of the alignment mark 13 can be clearly displayed when an exposure machine is used for exposure during subsequent processes. The pattern may be directly captured for alignment. In other words, the exposure machine does not need to capture the alignment mark 13, but only needs to capture the "copied" pattern same as the alignment mark 13 above it for accurate alignment. In this way, the black matrix 30 of the alignment mark area 130 needs not to be cleaned, which improves alignment efficiency, and the alignment method is not easily affected by human factors, which improves the production capacity and yield of the display panel.

The display motherboard according to the embodiment of the present disclosure will be described in detail below.

In the present disclosure, the display motherboard may refer to a large panel before cutting if the alignment mark is provided outside a motherboard cutting line, and the display motherboard may refer to a display panel after cutting if the alignment mark is provided inside the motherboard cutting line. In short, the array substrate may be interpreted as the display motherboard of the present disclosure as long as it is provided with the above-mentioned alignment mark and film layer thereon. In the field, it may be called a display substrate, etc., as well.

Referring to FIG. 1, FIG. 1 is a structural schematic diagram illustrating an OLED display motherboard in an exemplary embodiment of the present disclosure. The display motherboard includes a display area 110 located centrally and a peripheral area 120 surrounding the display area 110. Light-emitting units and pixel circuits for driving the light-emitting units to emit light are provided in the display area 110. A drive circuit, various signal lines, motherboard cutting lines, test lines, and the alignment mark 13 are provided in the peripheral area 120.

Figure 2:
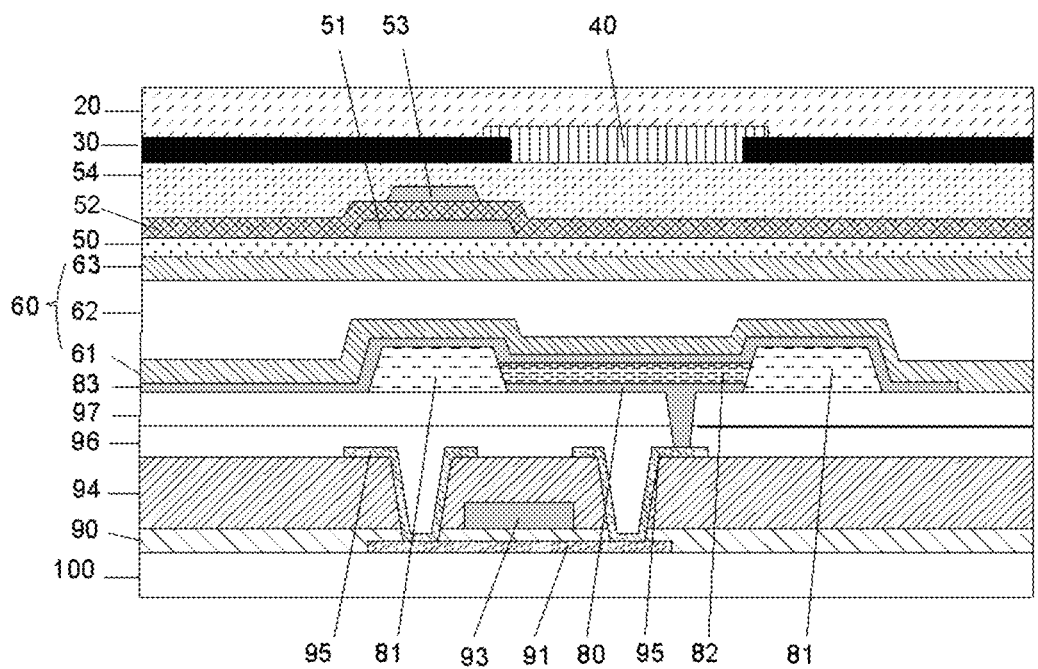
FIG. 2 is a cross-sectional view showing a portion of the display area in FIG. 1 in an A-A direction.

A cross-sectional view of the display area 110 is as shown in FIG. 2. FIG. 2 is a cross-sectional view showing a portion of the display area 110 (AA area) in an A-A direction in FIG. 1, which only schematically illustrates a cross-sectional structural schematic diagram of a sub-pixel. A pixel circuit which includes a drive transistor is provided on the array substrate. Specifically, the array substrate includes a substrate 100 and a drive transistor located on one side of the substrate 100. For example, the drive transistor includes an active layer 91, a gate insulating layer 90, a gate electrode layer 93, an interlayer insulating layer 94, a source-drain layer 95, a passivation layer 96, a planarization layer 97, and the like. It should be noted that the structure of the drive transistor is not limited to this, and may be determined according to actual needs.

An OLED organic light-emitting device is provided in the display area 110 of the array substrate. Returning back to FIG. 2, the OLED organic light-emitting device includes a first electrode layer 80, a second electrode layer 83, and a light-emitting layer 82 provided between the first electrode layer 80 and the second electrode layer 83. A pixel definition layer 81 for defining sub-pixels is further provided on the array substrate. The pixel definition layer 81 has an opening which exposes the first electrode layer 80, and the light-emitting layer 82 is disposed within the opening. The second electrode layer 83 may be a whole surface of film layer covering the light-emitting layer 82 and the pixel-definition layer 81. The first electrode layer 80 is connected to a drain (or source) electrode of the drive transistor to make the light-emitting layer 82 emit light under the drive of the drive transistor.

An encapsulation layer 60 is provided above the OLED organic light-emitting device to provide protection for the light-emitting device. Referring again to FIG. 2, in this exemplary embodiment, the encapsulation layer 60 includes a first inorganic encapsulation layer 61, an organic encapsulation layer 62, and a second inorganic encapsulation layer 63 that are laminated in an order of from bottom to top. The two inorganic encapsulation layers play the main role of preventing water and oxygen intrusion, and may be made of material of nitride, oxide, oxynitride, silicate, carbide, or any combination thereof. The organic encapsulation layer 62 plays the role of assisting the encapsulation and of planarization, and may be made of material of acrylic, hexamethyldisiloxane, polyacrylates, polycarbonates, polystyrene, etc. The two inorganic encapsulation layers usually extend from the display area 110 to the peripheral area 120 for encapsulation and protection of the traces in the peripheral area 120, thereby improving encapsulation effect. The encapsulation layer of the present application is not limited to this structure.

Figure 4:
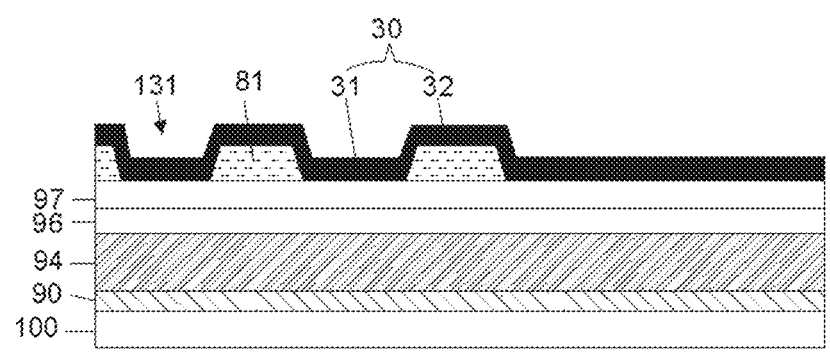
FIG. 4 is a cross-sectional view of the alignment mark in a B-B direction in FIG. 3.
Figure 6:
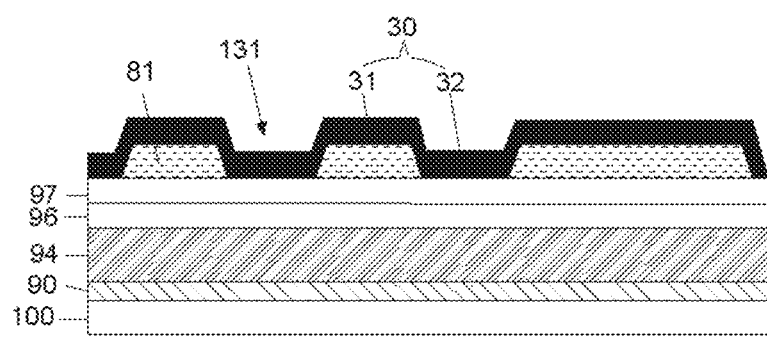
FIG. 6 is a cross-sectional view of the alignment mark in a B-B direction in FIG. 5.

Returning back to FIG. 2, the encapsulation layer 60 is provided thereon with a color film layer, and the color film layer includes a filter layer 40 and a black matrix 30. The filter layer 40 includes a red filter layer 40, a green filter layer 40, and a blue filter layer 40 corresponding to the respective sub-pixels, and the filter layers 40 of the respective colors can allow light of the corresponding color to pass and prevent light of other colors from passing so as to reduce the influence of ambient light on the luminous effect and increase the color gamut. The black matrix 30 is located in at least the display area 110 and the alignment mark area 130, and the black matrix 30 located in the display area 110 is alternately disposed between the filter layers 40 of the adjacent sub-pixels, to prevent light crosstalk. Referring to FIG. 4 or FIG. 6, the black matrix 30 located in the alignment mark area 130 covers the alignment mark 13. Referring to FIG. 2, an external protective layer 20 is further provided on the color film layer.

Figure 3:
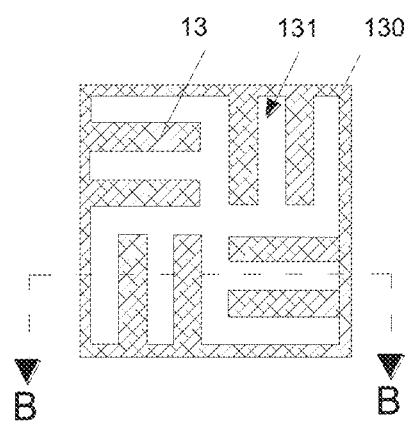
FIG. 3 is a top view showing a swastika shape alignment mark.
Figure 5:
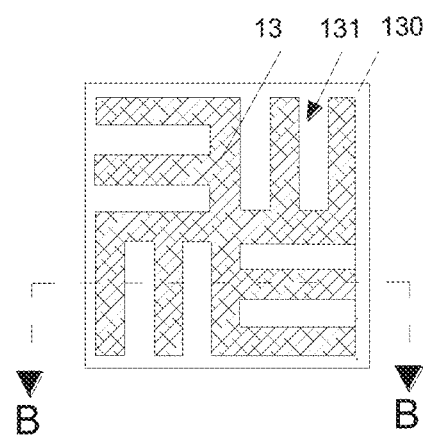
FIG. 5 is another top view showing a swastika shape alignment mark.

Referring collectively to FIGS. 1, 3 and 5, the alignment mark 13 is provided in the alignment mark area 130 in the peripheral area 120 of the display motherboard. The alignment mark 13 may be formed by the existing film layer, i.e., may be formed by patterning. Referring to FIGS. 3 and 5, patterns of the alignment mark are illustrated, and the pattern of the alignment mark is a "swastika" shape. The alignment mark may be in other shapes, such as "cross-shape." Centrosymmetric patterns are preferably selected for the alignment mark for precise localization.

In an exemplary embodiment, the alignment mark area 130 of the display motherboard includes an organic layer, the alignment mark 13 is formed by patterning the organic layer, and the portion of the black matrix 30 in the alignment mark area 130 is disposed on one side of the organic layer distal to the array substrate. The organic layer may be easily made with a larger thickness, and so made alignment mark 13 itself will have a structure with a greater height difference, such that the first light-shielding portion 31 and the second light-shielding portion 32 above the organic layer will have a great height difference as well, which can be clearly displayed in the subsequent processes and can be easily captured for alignment.

In the present disclosure, there may be two types of alignment mark 13 formed with the organic layer, and both of the two types of alignment mark 13 may "replicate" the same pattern in the corresponding area of the black matrix 30. Description will be made by taking the swastika shape alignment mark as an example.

In an exemplary embodiment, referring to FIGS. 3 and 4, FIG. 3 is a top view showing the swastika shape alignment mark, and FIG. 4 is a cross-sectional view in a B-B direction in FIG. 3. The organic layer has a hollow portion 131 penetrating the array substrate in a thickness direction (i.e., the vertical direction in the figure), and the hollow portion 131 forms the alignment mark 13. That is, the alignment mark 13 is a portion of the organic layer that is removed. As can be seen from FIG. 3, after the organic layer is patterned, the removed portion forms the pattern of the alignment mark, which is called a "window shape" mark. When the black matrix 30 covers the area, the first light-shielding portion 31 covers the hollow portion 131 of the organic layer, and the second light-shielding portion 32 covers a portion of the organic layer outside the hollow portion 131. As can be seen from the cross-sectional view, an upper surface of the second light-shielding portion 32 is higher than an upper surface of the first light-shielding portion 31. Therefore, the black matrix 30 forms a concave-convex mark pattern same as the pattern of the alignment mark 13 in the area.

In another exemplary embodiment, referring to FIGS. 5 and 6, FIG. 5 is another top view showing the swastika shape alignment mark, and FIG. 6 is a cross-sectional view in a B-B direction in FIG. 5. The organic layer has a hollow portion 131 penetrating the array substrate in a thickness direction (i.e., a vertical direction in the figure), and a portion of the organic layer outside the hollow portion 131 forms the alignment mark 13. That is, the alignment mark 13 is a portion of the organic layer that is not removed. As can be seen in FIG. 5, after the organic layer is patterned, the remained organic layer forms the pattern of the alignment mark 13, which is called an "island shape" mark. When the black matrix 30 covers the area, the second light-shielding portion 32 covers the hollow portion 131 of the organic layer, and the first light-shielding portion 31 covers the portion of the organic layer outside the hollow portion 131. As can be seen from the cross-sectional view, an upper surface of the first light-shielding portion 31 is higher than an upper surface of the second light-shielding portion 32. Therefore, the black matrix 30 forms a concave-convex mark pattern same as the pattern of the alignment mark 13 in the area.

In the present disclosure, the organic layer for forming the alignment mark 13 may be a single film layer as shown in the figure, or a plurality of laminated film layers. It should be understood that the thicker the film layer is, the greater a step of the alignment mark 13 may be formed. However, if the film layer is too thick, a slope angle formed in leveling of the organic layer will be smaller, which leads to that the boundary may not be significant, thus making it difficult to form a big step. Therefore, a thickness of the organic layer and the formed step is preferably to be between 1.5 µm and 2.5 µm. That is to say, a difference between a distance from a lower surface of the first light-shielding portion 31 to the array substrate and a distance from a lower surface of the second light-shielding portion 32 to the array substrate is between 1.5 µm and 2.5 µm. A height step of the pattern formed under this condition is greater, so it will be displayed more clearly under the exposure condition.

In an exemplary embodiment, the organic layer of the alignment mark area 130 and the pixel definition layer 81 of the display area 110 are provided on the same layer. In the present disclosure, the meaning of providing on the same layer is that they are formed of the same material by the same patterning process. As shown in FIGS. 4 and 6, the organic layer and the pixel definition layer 81 use the same fill line to express that they are formed of the same material by the same patterning process. The material of the pixel definition layer 81 is an organic material, so the pixel definition layer 81 has a larger thickness than that of other film layers, such that a thickness step of the formed alignment mark 13 is large, and correspondingly, a step between the first light-shielding portion 31 and the second light-shielding portion 32 above is larger as well, thus the pattern of the alignment mark 13 "copied" from the black matrix 30 can be displayed more clearly under the exposure condition and is more easily captured by the exposure machine, thus ensuring accurate positioning.

Figure 7:
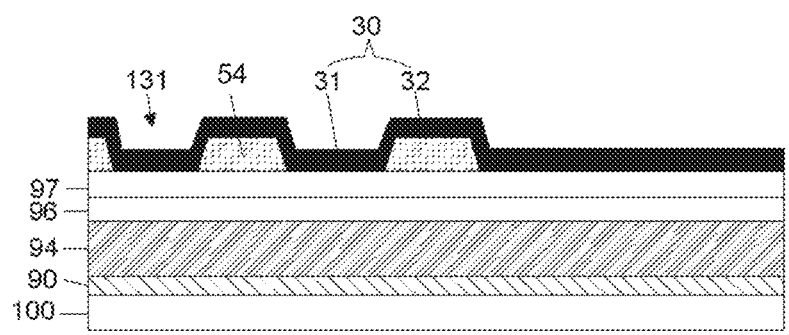
FIG. 7 is a cross-sectional view of a protective layer using an organic layer.

In another exemplary embodiment, returning back to FIG. 2, the OLED display motherboard may further include a touch function layer provided in the display area 110. That is, the display panel that is finally formed may be a display panel integrated with touch and COE. In the display motherboard of such structure, the touch function layer may be located between the encapsulation layer 60 and the black matrix 30, and specifically includes a first touch electrode layer 51 and a second touch electrode layer 53 provided opposite to each other and a dielectric layer 52 between the two touch electrode layers, wherein the first touch electrode layer 51 is provided close to the encapsulation layer 60 and the second touch electrode layer 53 is provided close to the color film layer. A buffer layer 50 may further be provided between the first touch electrode layer 51 and the encapsulation layer 60. The touch function layer may further include a protective layer 54 covering the second touch electrode layer 53. The protective layer 54 is disposed on one side of the second touch electrode layer 53 distal to the dielectric layer 52, for protecting the touch electrode layers. The material of the protective layer is an organic material. In this embodiment, the organic layer of the alignment mark area 130 and the protective layer 54 are provided on the same layer, as schematically shown in FIG. 7. The material of the protective layer 54 is an organic material, and has a larger thickness than that of other film layers, such that a thickness step of the formed alignment mark 13 is larger, and correspondingly, a step between the first light-shielding portion 31 and the second light-shielding portion 32 above is larger as well, thus the pattern of the alignment mark 13 "copied" by the black matrix 30 can be displayed more clearly under the exposure condition and is more easily captured by the exposure machine, thus ensuring accurate positioning.

In the above-described two embodiments, the alignment mark 13 with a great step may be manufactured only by one organic layer, so the manufacturing processes are simple. In other embodiments, the alignment mark 13 may be manufactured with one or more other film layers with a larger thickness. For example, the alignment mark 13 may be manufactured together with the planarization layer 97 in the array substrate, or together with the stacked planarization layer 97 and pixel definition layer 81 in the array substrate, or adopt other film layers such as inorganic layers, etc., having a larger thickness, as long as the black matrix 30 thereon presents clear patterns of the alignment mark 13 under the exposure machine.

Figure 8:
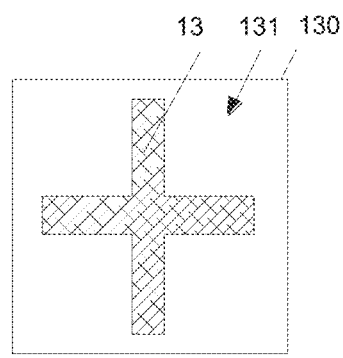
FIG. 8 is a top view showing a cross shape alignment mark.
Figure 9:
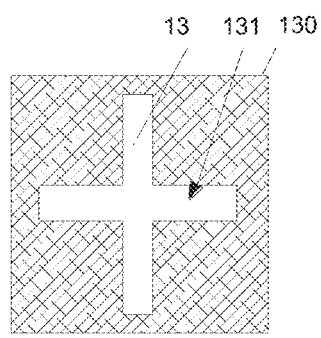
FIG. 9 is another top view showing a cross shape alignment mark.

The alignment mark 13 on the display motherboard of the present disclosure may be disposed outside the motherboard cutting line, i.e., disposed between display screen areas before cutting, or may be disposed inside the motherboard cutting line, i.e., disposed within the display screen areas. The number of the alignment mark 13 may be one or more, the positions at which the alignment marks 13 are provided may be designed as needed, and the shapes of a plurality of alignment marks 13 may be the same or different from each other. FIGS. 8 and 9 show two types of cross shape alignment mark, respectively, wherein the area without being filled with shade lines in the figures is the hollow portion 131, and the area filled with shade lines is the area outside the hollow portion.

Figure 10:
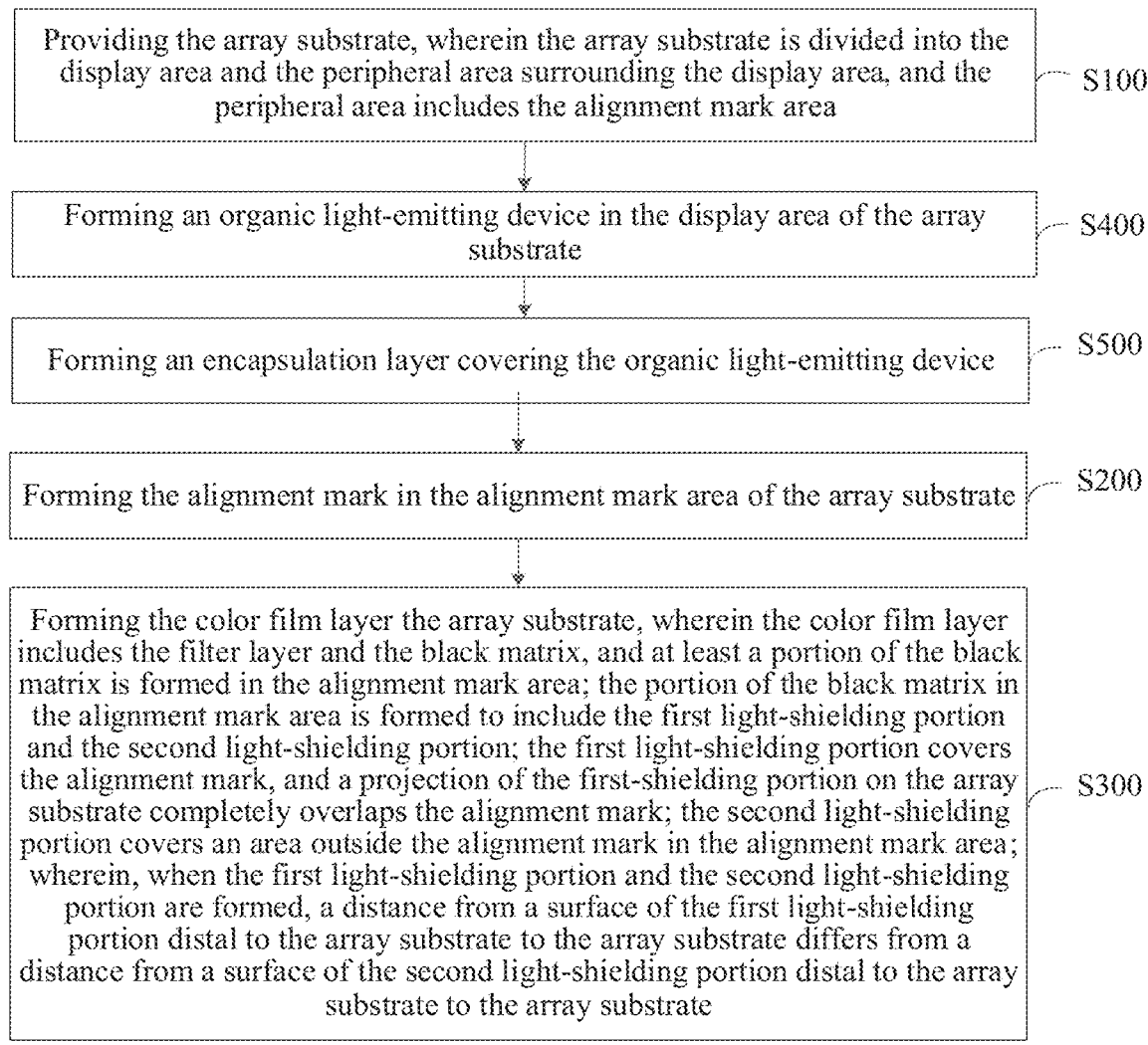
FIG. 10 is a flow chart showing a method for fabricating the display motherboard according to an embodiment of the present disclosure.

An embodiment of the present disclosure further provides a method for fabricating the above-described display motherboard. Referring to FIG. 10, the method includes:

In step S100, the array substrate is provided, wherein the array substrate is divided into the display area 110 and the peripheral area 120 surrounding the display area 110, and the peripheral area 120 includes the alignment mark area 130.

In step S200, the alignment mark 13 is formed in the alignment mark area 130 of the array substrate.

In step S300, the color film layer is formed on the array substrate, wherein the color film layer includes the filter layer 40 and the black matrix 30, and at least a portion of the black matrix 30 is formed in the alignment mark area 130. When the black matrix 30 is formed, the portion of the black matrix 30 located in the alignment mark area 130 is formed to include the first light-shielding portion 31 and the second light-shielding portion 32, the first light-shielding portion 31 covers the alignment mark 13, a projection of the first light-shielding portion 31 on the array substrate completely overlaps the alignment mark 13, and the second light-shielding portion 32 covers an area outside the alignment mark 13 in the alignment mark area 130. When the first light-shielding portion 31 and the second light-shielding portion 32 are formed, a surface of the first light-shielding portion 31 distal to the array substrate and a surface of the second light-shielding portion 32 distal to the array substrate are not in the same plane.

The above-described steps may further include a step 400 of the formation of the organic light-emitting device and a step 500 of the formation of the encapsulation layer covering the organic light-emitting device on the array substrate, and the fabrication processes of these structures may be layer-by-layer manufacture of existing conventional processes, and this application does not impose any special limitations on this. Taking an organic light-emitting device as an example, in combination with FIG. 2, the formation method thereof is as follows: the first electrode layer 80 is formed on the array substrate and then the pixel definition layer 81 is formed on one side of the first electrode layer 80 distal to the array substrate, wherein the pixel definition layer 81 has an opening area which exposes the first electrode layer 80. Next, the light-emitting layer 82 is formed on one side of the first electrode layer 80 distal to the array substrate to make the light-emitting layer 82 located in the opening area. Finally, the second electrode layer 83 is formed on one side of the light-emitting layer 82 distal to the array substrate. The encapsulation layer 60 may be provided on the second electrode layer 83. For a display motherboard integrated with touch and COE, a method for forming the touch function layer is as follows: a first touch electrode layer 51 is formed on one side of the encapsulation layer 60 distal to the array substrate; the dielectric layer 52 is formed on one side of the first touch electrode layer 51 distal to the encapsulation layer; then the second touch electrode layer 53 is formed on one side of the dielectric layer 52 distal to the first touch electrode layer 51; and finally, the protective layer 54 is formed on one side of the second touch electrode layer 53 distal to the dielectric layer 52.

In step S200, when the alignment mark 13 is formed, it may be formed with the film layer of the same material in the display area 110 simultaneously. Specifically, in the structure of the display motherboard as schematically shown in FIGS. 4 and 6, the alignment mark 13 is formed by an organic layer, wherein the organic layer and the pixel definition layer 81 are formed of the same material by the same patterning process. In the structure of the display motherboard integrated with touch and COE as schematically shown in FIG. 7, the alignment mark 13 is formed by an organic layer, wherein the organic layer and a protective layer 54 in the touch function layer are formed of the same material by the same patterning process. In the present disclosure, the patterning process may be exposure, development, inkjet printing, etc.

Further, when the alignment mark 13 is formed in this step, the alignment mark 13 formed by the hollow portion 131 as shown in FIGS. 3, 4, and 9 may be formed, or the alignment mark 13 formed by a portion outside the hollow portion 131 as shown in FIGS. 5, 6, and 8 may be formed as well.

In step S300, when the black matrix 30 in the color film layer is formed, the black matrix 30 may be formed by conventional processes, to cover the alignment mark area 130, thereby naturally forming the first light-shielding portion 31 and the second light-shielding portion 32 of different heights in the alignment mark area 130. When the hollow portion 131 of the organic layer forms the alignment mark 13, the first light-shielding portion 31 covers the hollow portion 131 and the second light-shielding portion 32 covers the portion outside the hollow portion 131. When the portion of the organic layer outside the hollow portion 131 forms the alignment mark 13, the first light-shielding portion 31 covers the portion of the organic layer outside the hollow portion 131, and the second light-shielding portion 32 covers the hollow portion 131.

An embodiment of the present disclosure further provides a method for aligning the above-mentioned display motherboard. During formation of the subsequent film layers for the above-mentioned display motherboard, positioning is needed. The method is specifically as follows: placing the above-mentioned display motherboard into the exposure machine, moving a capturing device of the exposure machine above the alignment mark area 130, identifying, by the exposure machine, the pattern formed by the first light-shielding portion 31 and the second light-shielding portion 32, and aligning by using the pattern formed by the first light-shielding portion 31 and the second light-shielding portion 32 as the alignment mark 13. In this way, the alignment may be completed quickly and accurately, which greatly improves the alignment efficiency and accuracy.

Referring to FIG. 11, FIG. 11 is an example of patterns of the display motherboard with the alignment mark of the present disclosure that are captured by the exposure machine, wherein the alignment mark and the pixel definition layer are provided on the same layer. The first two lines of the table is that the remained organic layer after the removal of the hollow portion is used as exposure pattern of the alignment mark, and the last two lines is that the hollow portion is used as exposure pattern of the alignment mark, where each type shows the Swastika shape and cross shape alignment marks, respectively. As can be seen from the figure, the display panels of the two types of alignment mark structures and the two types of patterns can be clearly displayed under the exposure machine, which illustrates that the black matrix forms patterns with a clear boundary above the alignment mark that can realize precise alignment.

Although terms having opposite meanings such as "on" and "below" are used herein to describe the relationship of one component relative to another component, such terms are used herein only for the sake of convenience, for example, "in the direction illustrated in the figures". It can be understood that if a device denoted in the drawings is turned upside down, a component referred to as "on" something will be referred to as "below" something. When a structure is referred to as "on" another structure, it probably means that the structure is integrally formed on another structure, or the structure is "directly" disposed on another structure, or the structure is "indirectly" disposed on another structure through a further another structure.

Terms such as "one", "an/a", "the", "said" and "at least one" are used herein to indicate the presence of one or more elements/component parts/and others. Terms "include" and "have" have an inclusive meaning which means that there may be additional elements/component parts/and others in addition to the listed elements/component parts/and others.

Other embodiments of the disclosure will be apparent to those skilled in the art from consideration of the specification and practice of the disclosure disclosed here. This disclosure is intended to cover any variations, uses, or adaptations of the disclosure following the general principles thereof and including such departures from the present disclosure as come within known or customary practice in the art. It is intended that the specification and examples be considered as exemplary only, with a true scope and spirit of the disclosure being indicated by the following claims.

What is claimed is:
1. A display motherboard, comprising:
a display area and a peripheral area surrounding the display area, wherein the peripheral area comprises an alignment mark area;
an array substrate;
an alignment mark disposed on the array substrate and in the alignment mark area; and a color film layer comprising a filter layer and a black matrix, wherein at least a portion of the black matrix is located in the alignment mark area, wherein the portion of the black matrix in the alignment mark area comprises a first light-shielding portion and a second light-shielding portion, the first light-shielding portion covers the alignment mark, and the second light-shielding portion covers an area outside the alignment mark in the alignment mark area, wherein a surface of the first light-shielding portion distal to the array substrate and a surface of the second light-shielding portion distal to the array substrate are not in a same plane, and wherein the display motherboard further comprises:

an organic layer disposed on the array substrate and at least in the alignment mark area, wherein the organic layer has a hollow portion penetrating the array substrate in a thickness direction, the portion of the black matrix in the alignment mark area is disposed on one side of the organic layer distal to the array substrate, and the alignment mark is formed in the organic layer.

2. The display motherboard according to claim 1, wherein the organic layer is a single layer or comprises a plurality of layers.

3. The display motherboard according to claim 2, wherein the display motherboard further comprises an organic light-emitting device located in the display area, and the organic light-emitting device comprises:

a first electrode disposed on the array substrate;

a pixel definition layer disposed on one side of the first electrode distal to the array substrate, wherein the pixel definition layer has an opening area, and the opening area exposes the first electrode;

an organic light-emitting function layer disposed on one side of the first electrode distal to the array substrate and located in the opening area; and a second electrode disposed on one side of the organic light-emitting function layer distal to the array substrate, wherein the organic layer and the pixel definition layer are provided in a same layer.

4. The display motherboard according to claim 2, wherein the display motherboard further comprises a touch function layer disposed in the display area, and the touch function layer is located between the array substrate and the black matrix, comprising:

a first touch electrode layer, disposed on the array substrate;

a dielectric layer disposed on one side of the first touch electrode layer distal to the array substrate;

a second touch electrode layer disposed on one side of the dielectric layer distal to the first touch electrode layer and located on one side of the black matrix close to the array substrate; and a protective layer disposed on one side of the second touch electrode layer distal to the dielectric layer, wherein the organic layer and the protective layer are provided in a same layer.

5. The display motherboard according to claim 1, wherein:

the hollow portion forms the alignment mark, and the first light-shielding portion of the black matrix covers the hollow portion of the organic layer, and the second light-shielding portion covers a portion of the organic layer outside the hollow portion.

6. The display motherboard according to claim 1, wherein:

a portion of the organic layer outside the hollow portion forms the alignment mark, and the first light-shielding portion of the black matrix covers the portion of the organic layer outside the hollow portion, and the second light-shielding portion covers the hollow portion of the organic layer.

7. The display motherboard according to claim 1, wherein a thickness of the organic layer and a step of the organic layer is between 1.5 μm and 2.5 μm.

8. A method for fabricating a display motherboard, comprising:

providing an array substrate, wherein the array substrate is divided into a display area and a peripheral area surrounding the display area, and the peripheral area comprises an alignment mark area;

forming an alignment mark in the alignment mark area of the array substrate; and forming a color film layer on the array substrate, wherein the color film layer comprises a filter layer and a black matrix, and at least a portion of the black matrix is formed in the alignment mark area, wherein, when the black matrix is formed, the portion of the black matrix located in the alignment mark area is formed to comprises a first light-shielding portion and a second light-shielding portion, the first light-shielding portion covers the alignment mark, and the second light-shielding portion covers an area outside the alignment mark in the alignment mark area, wherein, when the first light-shielding portion and the second light-shielding portion are formed, a surface of the first light-shielding portion distal to the array substrate and a surface of the second light-shielding portion distal to the array substrate are not in a same plane, and wherein forming the alignment mark in the alignment mark area of the array substrate comprises:

forming an organic layer in the alignment mark area, such that the organic layer has a hollow portion penetrating the array substrate in a thickness direction, and the hollow portion of the organic layer forms the alignment mark or a portion of the organic layer outside the hollow portion forms the alignment mark.

9. The method according to claim 8, wherein the fabricating method further comprises forming an organic light-emitting device in the display area, and forming the organic light-emitting device comprises:

forming a first electrode on the array substrate;

forming a pixel definition layer on one side of the first electrode distal to the array substrate, wherein the pixel definition layer has an opening area, such that the opening area exposes the first electrode;

forming an organic light-emitting function layer on one side of the first electrode distal to the array substrate, such that the organic light-emitting function layer is located in the opening area; and forming a second electrode on one side of the organic light-emitting function layer distal to the array substrate, wherein the organic layer and the pixel definition layer are formed of a same material by a same patterning process.

10. The method according to claim 8, wherein the fabricating method further comprises forming a touch function layer in the display area, and forming the touch function layer comprises:

forming a first touch electrode layer on the array substrate;

forming a dielectric layer on one side of the first touch electrode layer distal to the array substrate;

forming a second touch electrode layer on one side of the dielectric layer distal to the first touch electrode layer; and forming a protective layer on one side of the second touch electrode layer distal to the dielectric layer, wherein the organic layer and the protective layer are formed of a same material by a same patterning process, and wherein the black matrix is formed on one side of the touch function layer distal to the array substrate.

11. A method for aligning a display motherboard, comprising:

providing the display motherboard, wherein the display motherboard comprises:

a display area and a peripheral area surrounding the display area, wherein the peripheral area comprises an alignment mark area; an array substrate; an alignment mark, disposed on the array substrate and in the alignment mark area; and a color film layer comprising a filter layer and a black matrix, wherein at least a portion of the black matrix is located in the alignment mark area, the portion of the black matrix in the alignment mark area comprises a first light-shielding portion and a second light-shielding portion, the first light-shielding portion covers the alignment mark, the second light-shielding portion covers an area outside the alignment mark in the alignment mark area, and a surface of the first light-shielding portion distal to the array substrate and a surface of the second light-shielding portion distal to the array substrate are not in a same plane;

placing the display motherboard into an exposure machine;

moving a capturing device of the exposure machine above the alignment mark area;

identifying a pattern formed by the first light-shielding portion and the second light-shielding portion; and aligning through the pattern formed by the first light-shielding portion and the second light-shielding portion;

wherein the display motherboard further comprises:

an organic layer, disposed on the array substrate and at least in the alignment mark area, wherein the organic layer has a hollow portion penetrating the array substrate in a thickness direction, the portion of the black matrix in the alignment mark area is disposed on one side of the organic layer distal to the array substrate, and the alignment mark is formed in the organic layer.

12. The method according to claim 11, wherein the organic layer is a single layer or comprises a plurality of layers.

13. The method according to claim 12, wherein the display motherboard further comprises an organic light-emitting device located in the display area, and the organic light-emitting device comprises:

a first electrode, disposed on the array substrate;

a pixel definition layer, disposed on one side of the first electrode distal to the array substrate, wherein the pixel definition layer has an opening area, and the opening area exposes the first electrode;

an organic light-emitting function layer, disposed on one side of the first electrode distal to the array substrate and located in the opening area; and a second electrode, disposed on one side of the organic light-emitting function layer distal to the array substrate, wherein the organic layer and the pixel definition layer are provided in a same layer.

14. The method according to claim 12, wherein the display motherboard further comprises a touch function layer disposed in the display area, and the touch function layer is located between the array substrate and the black matrix, comprising:

a first touch electrode layer, disposed on the array substrate;

a dielectric layer, disposed on one side of the first touch electrode layer distal to the array substrate;

a second touch electrode layer, disposed on one side of the dielectric layer distal to the first touch electrode layer and located on one side of the black matrix close to the array substrate; and a protective layer, disposed on one side of the second touch electrode layer distal to the dielectric layer, wherein the organic layer and the protective layer are provided in a same layer.

15. The method according to claim 11, wherein:

the hollow portion forms the alignment mark, and the first light-shielding portion of the black matrix covers the hollow portion of the organic layer, and the second light-shielding portion covers a portion of the organic layer outside the hollow portion.

16. The method according to claim 11, wherein:

a portion of the organic layer outside the hollow portion forms the alignment mark, and the first light-shielding portion of the black matrix covers the portion of the organic layer outside the hollow portion, and the second light-shielding portion covers the hollow portion of the organic layer.

17. The method according to claim 11, wherein a thickness of the organic layer and a step of the organic layer is between 1.5 µm and 2.5 µm.

* * * * *